United States Patent
Nittka et al.

(10) Patent No.: US 6,853,190 B2
(45) Date of Patent: Feb. 8, 2005

(54) METHOD AND APPARATUS FOR MAGNETIC RESONANCE IMAGING WITH SIMULTANEOUS MEASUREMENT OF TWO NEIGHBORING SLICES

(75) Inventors: Mathias Nittka, Baiersdorf (DE); Jianmin Wang, Erlangen (DE)

(73) Assignee: Siemens Aktiengesellschaft, Münich (DE)

(*) Notice: Subject to any disclaimer, the term of this patent is extended or adjusted under 35 U.S.C. 154(b) by 19 days.

(21) Appl. No.: 10/280,349

(22) Filed: Oct. 25, 2002

(65) Prior Publication Data

US 2003/0097058 A1 May 22, 2003

(30) Foreign Application Priority Data

Oct. 25, 2001 (DE) .......................... 101 52 734

(51) Int. Cl.$^7$ .............. G01V 3/00; A61B 5/05
(52) U.S. Cl. .............. 324/309; 324/307; 324/306; 324/318; 600/410
(58) Field of Search ............ 324/309, 307, 324/306; 600/410

(56) References Cited

U.S. PATENT DOCUMENTS

| 4,843,322 | A | * | 6/1989 | Glover .................. 324/309 |
| 5,635,837 | A | | 6/1997 | Bönert .................. 324/309 |
| 5,910,728 | A | * | 6/1999 | Sodickson ............. 324/309 |
| 6,400,151 | B1 | * | 6/2002 | Haase et al. .......... 324/309 |
| 6,734,673 | B2 | * | 5/2004 | Agrikola .............. 324/318 |
| 2002/0115929 | A1 | * | 8/2002 | Machida ............... 600/410 |
| 2003/0069495 | A1 | * | 4/2003 | Agrikola .............. 600/410 |
| 2003/0097058 | A1 | * | 5/2003 | Nittka et al. ......... 600/410 |

FOREIGN PATENT DOCUMENTS

| EP | 0 213 858 | 8/1986 |
| EP | 0 219 206 | 8/1986 |

OTHER PUBLICATIONS

Larkman et al., Article "Use of Multicoil Arrays for Separation of Signal from Multiple Slices Simultaneously Excited" Journal of Magnetic Resonance Imaging No. 13 pp. 313–317 Feb. 2001.*

"Sima: Simultaneous Multislice Acquisition of MR Images by Hadamard–Encoded Excitation," Souza et al., J. of Computer Assisted Tomography, vol. 12, No. 6 (1988), pp. 1026–1030.

Multifrequency Selective rf Pulses for Multislice MR Imaging, Müller, Magnetic Resonance in Medicine, vol. 6 (1998), pp. 364–371.

* cited by examiner

*Primary Examiner*—Diego Gutierrez
*Assistant Examiner*—Tiffany A. Fetzner
(74) *Attorney, Agent, or Firm*—Schiff Hardin LLP

(57) ABSTRACT

In a magnetic resonance tomography apparatus and a method for the operation thereof, two neighboring slices of an examination subject are simultaneously excited and the measurement time thus can be shortened without SNR loss. The radiofrequency excitation pulse encodes the first slice with a phase offset of +90° or −90° compared to the second slice, so that a response signal contains magnetization information about both slices, [this information] being separated on the basis of the phase offset.

8 Claims, 2 Drawing Sheets

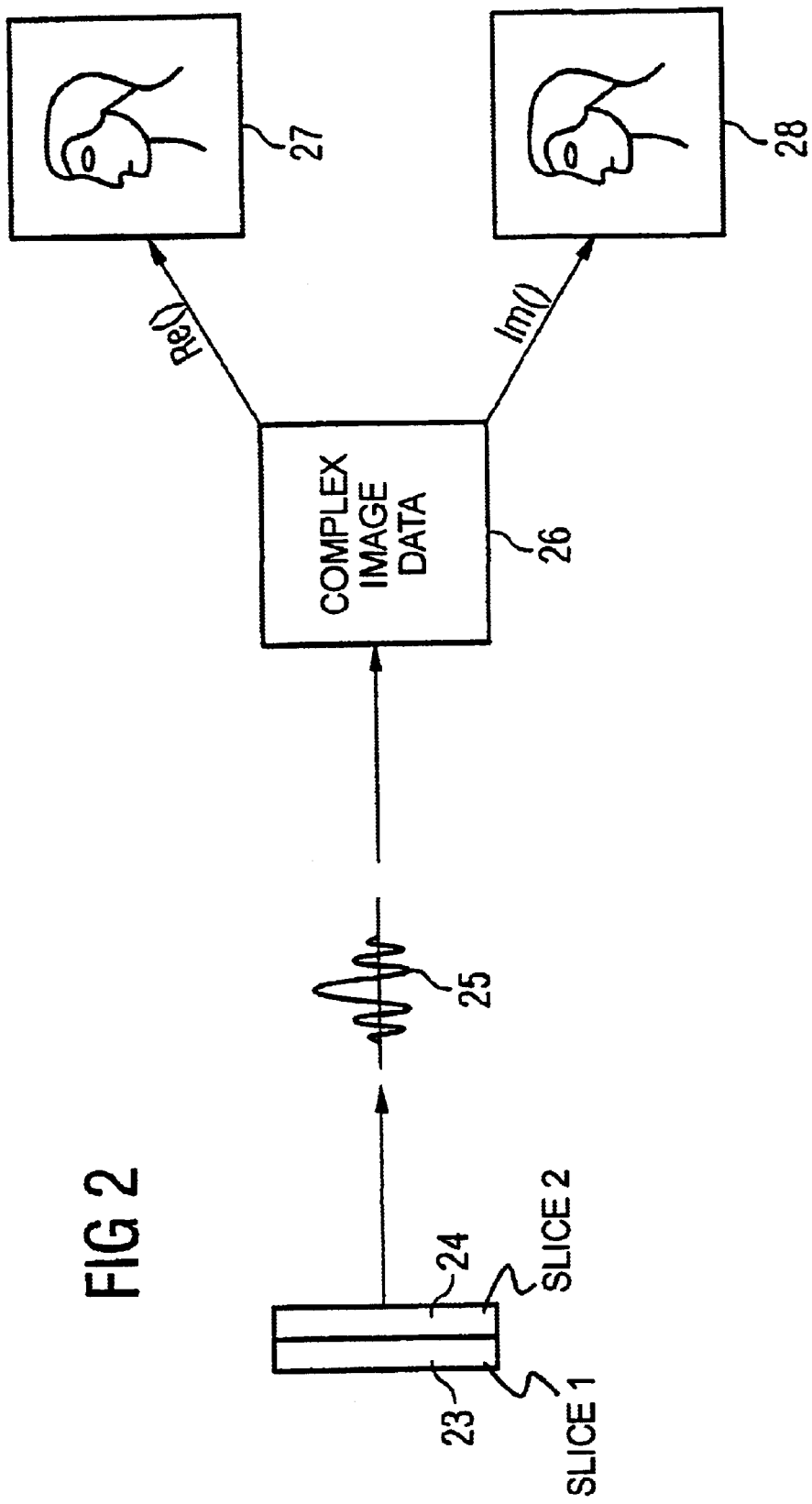

METHOD AND APPARATUS FOR MAGNETIC RESONANCE IMAGING WITH SIMULTANEOUS MEASUREMENT OF TWO NEIGHBORING SLICES

BACKGROUND OF THE INVENTION

1. Field of the Invention

The present invention is directed in general to magnetic resonance tomography (MRT) as employed in medicine for examining patients. The present invention is specifically directed to a magnetic resonance tomography apparatus as well as to a method for the operation thereof wherein magnetic resonance data are obtained from two immediately adjacent slices so the measurement time can be shortened without SNR (signal-to-noise ratio) loss.

2. Description of the Prior Art

MRT is based on the physical phenomenon of nuclear magnetic resonance and has been successfully utilized as an imaging method in medicine and biophysics for more than 15 years. In this examination method, the subject is exposed to a strong, constant magnetic field. As a result, the nuclear spins of the atoms in the subject align, these having been previously irregularly oriented.

Radiofrequency energy can then excite these "ordered" nuclear spins to a specific oscillation. This oscillation generates the actual measured signal in MRT, this being detected with suitable reception coils. The measurement subject can be spatially encoded in all three spatial directions by utilizing non-homogeneous magnetic fields generated by gradient coils. The method allows a free selection of the slice to be imaged, so that tomograms of the human body can be registered in all directions. In medical diagnostics, MRT is particularly distinguished as a tomographic imaging method which is "non-invasive" as a result of a versatile contrast capability. Due to the excellent presentation of soft tissue, MRT has developed into a method that is often superior to X-ray computed tomography (CT). MRT is currently based on the application of spin echo sequences and gradient echo sequences that enable an excellent image quality with measurement times on the order of magnitude of minutes.

The ongoing technical improvement of the components of MRT apparatuses and the introduction of fast imaging sequences have made more areas of application in medicine accessible to MRT. Real-time imaging for supporting minimally invasive surgery, functional imaging in neurology and perfusion measurement in cardiology are only a few examples. Despite the technical advances in building MRT apparatuses, exposure time and signal-to-noise ratio (SNR) of the MRT image remain limiting factors for many applications of MRT in medical diagnostics.

One method of enhancing the relationship of SNR per measurement time is the simultaneous measurement of multiple slices. Either the measurement time can be shortened—given an SNR that remains the same—or the SNR can be enhanced—given a measurement time that remains the same.

One approach for the former—i.e. unmodified SNR and shortening the measurement time—is to reduce the quantity of image data to be acquired. In order to obtain a complete image from such a reduced dataset, either the missing data must be reconstructed with suitable algorithms or the faulty image must be corrected from the reduced data. The registration of the data in MRT occurs in k-space (frequency domain). The MRT image in the image domain is linked to the MRT data in k-space by Fourier transformation. The location coding of the subject, which defines k-space, occurs by means of gradients in all three spatial directions. A distinction is made between the slice selection (determines an exposure slice in the subject, usually the z-axis), the frequency coding (determines a direction in the slice, usually the x-axis) and the phase coding (determines the second dimension within the slice, usually the y-axis). Without limitation as to universality, a Cartesian k-space that is sampled row-by-row is assumed below. The data of an individual k-space row are frequency-coded with a gradient upon readout. Each row in k-space has a spacing $\Delta k_y$ that is generated by a phase-coding step. Since the phase-coding takes a great deal of time compared to the other spatial coordinates, most methods for shortening the image measurement time are based on a reduction of the number of time-consuming phase-coding steps, for example partially parallel acquisition (abbreviated below as PPA). The basic idea in PPA imaging is that k-space data are not acquired by an individual coil but by, for example, a linear arrangement of component coils, a coil array. Each of the spatially independent coils of the array has associated spatial information that is utilized in order to achieve a complete location encoding via a combination of the simultaneously acquired coil data. This means that a number of other, unsampled rows shifted in k-space also can be defined from a single, registered k-space row.

The PPA methods thus employ spatial information that is contained in the components of a coil arrangement in order to partially replace the time-consuming phase encoding that is normally generated upon employment of a phase gradient. As a result, the image measurement time is reduced, corresponding to the ratio of the number of rows of the reduced dataset to the number of rows of the conventional (i.e. complete) dataset. In a typical PPA acquisition, only a fraction (½, ⅓, ¼, etc.) of the phase-coding rows are acquired compared to the conventional acquisition. A specific reconstruction is then applied to the data in order to reconstruct the missing k-space rows, and thus to obtain the full field of view (FOV) image in a fraction of the time.

Whereas some of these PPA techniques have been successfully employed in many areas of MRT-SMASH (SiMultaneous Acquisition of Spatial Harmonics) and SENSE (SENSitivity Encoding) are the most noteworthy—a significant disadvantage of these methods is that the coil profiles must clearly differ in the superimposed slices. This is only true for slices that are relatively far apart and therefore cannot be applied to immediately adjacent slices. A typical distance between the coil elements of an array coil is approximately 10 cm. A slice spacing of simultaneously encoded slices of precisely this order of magnitude arises therefrom. Moreover, a slice can generally not be freely selected but must be matched to the geometry of the reception coil array.

One approach for enhancing the SNR given an unaltered acquisition time is to simultaneously excite multiple slices with specific excitation pulses. The problem then is to reconstruct separated slices from the raw data signal.

One method with which two or more slices are simultaneously excited and subsequently reconstructed was presented in 1988 by S. P. Souza et al., Journal of Computer Assisted Tomography, 12(6):1026–1030 (1988) and by S.M üller, Magnetic Resonance in Medicine, 6:364–371 (1988). The radiofrequency excitation pulse, whose base band: signal usually represents a square-wave or sinc (si) function, is modulated with corresponding offset frequencies $\omega_1$, $\omega_2$, etc. (compared to the basic frequency). As a result the slices corresponding to $\omega_1$, $\omega_2$, etc. are excited:

$$RF(t)=si(t)e^{i\omega_1 t''}e^{i\omega_1 t''}$$

The excitation by RF(t) as well as the following response signal measurement are multiply implemented. The slices are encoded with different operational sign from measurement to measurement. By means of a suitable combination of signal subtraction and signal addition, the slices superimposed in the measured signals can in turn be subsequently reconstructed. This results in the SNR being improved in each superposition. A disadvantage in this method, however, is the fact that a measurement is required for each slice, so that the SNR can in fact be improved but the measurement time remains the same compared to conventional encoding.

SUMMARY OF THE INVENTION

It is an object of the present invention to provide a method for magnetic resonance imaging and an apparatus for the implementation of the method where the above problems are avoided or reduced.

This object is inventively achieved in a method for generating a magnetic resonance image of a subject including the steps of generating gradient pulses, generating radiofrequency excitation pulses, and sampling the response signals, wherein the radiofrequency excitation pulse is configured such that it simultaneously excites a first slice and a second slice of nuclear spins in the subject region to be measured, the two slices being adjacent.

Inventively, the radiofrequency excitation pulse encodes the first slice with a phase offset of +90° or −90° compared to the second slice, so that the response signal contains magnetization information about both slices, this information being separated on the basis of the phase offset.

Inventively, thus, the magnetization density of the two slices can be calculated on the basis of the real part and the imaginary part of the response signal from the complex response signal that has been measured, without requiring a separate measurement for each slice. Compared, for example, to the PPA techniques, no array coil is required according to this method. For this reason, immediately adjacent slices, i.e. slices separated from one another in the kHz range, can be excited.

The signal reception characteristics (coil sensitivities) of the detection coils must be utilized for calculating the magnetization density of the two slices since these impress a location-dependent phase on the measured magnetization and this must be taken into consideration in the calculation. The coil sensitivities can be obtained in a first embodiment by means of a separate reference measurement.

In a second embodiment for obtaining the coil sensitivities is to suitably combine additional measured rows with the original measured rows, with the first slice being encoded with a phase offset of −90° or +90° compared to the second slice in the excitation with respect to the additional measured rows. This second embodiment advantageously exhibits a significantly shorter measuring duration, since a reference measurement can be omitted.

When coil sensitivities with reduced resolution compared to the actual image are employed for the reconstruction (in order to shorten the measurement time), it is advantageous to only view their phases and to normalize the amplitudes of the coil sensitivities to a constant value (for example, 1). A reduced resolution automatically occurs in the second embodiment (implicit reference measurement) but is also meaningful for the first embodiment employing a separate reference measurement (lowered resolution yields shortened measurement time).

It should be noted that the normalization to constant amplitudes of the coil sensitivities is implicitly contained in the calculation of the method according to the second embodiment.

It should also be noted that the normalization to constant amplitudes of the coil sensitivities results in the calculated slices being weighted with the sensitivity profiles of the coils, i.e. they do not exhibit a uniform brightness when the coil sensitivities are not uniform over the slice.

In order to avoid artifacts, in an embodiment of the invention it is assumed that the phase of the coil profiles between a first and second slice amounts to exactly +90° or −90° in regions of the registered slices with low signal intensity, or below a defined threshold.

The present invention advantageously employs spin echo sequences.

The above object also is achieved in a magnetic resonance tomography apparatus for the implementation of the above-described method.

DESCRIPTION OF THE DRAWINGS

FIG. 2 schematically illustrates the inventive method.

DESCRIPTION OF THE PREFERRED EMBODIMENTS

Figure 1:
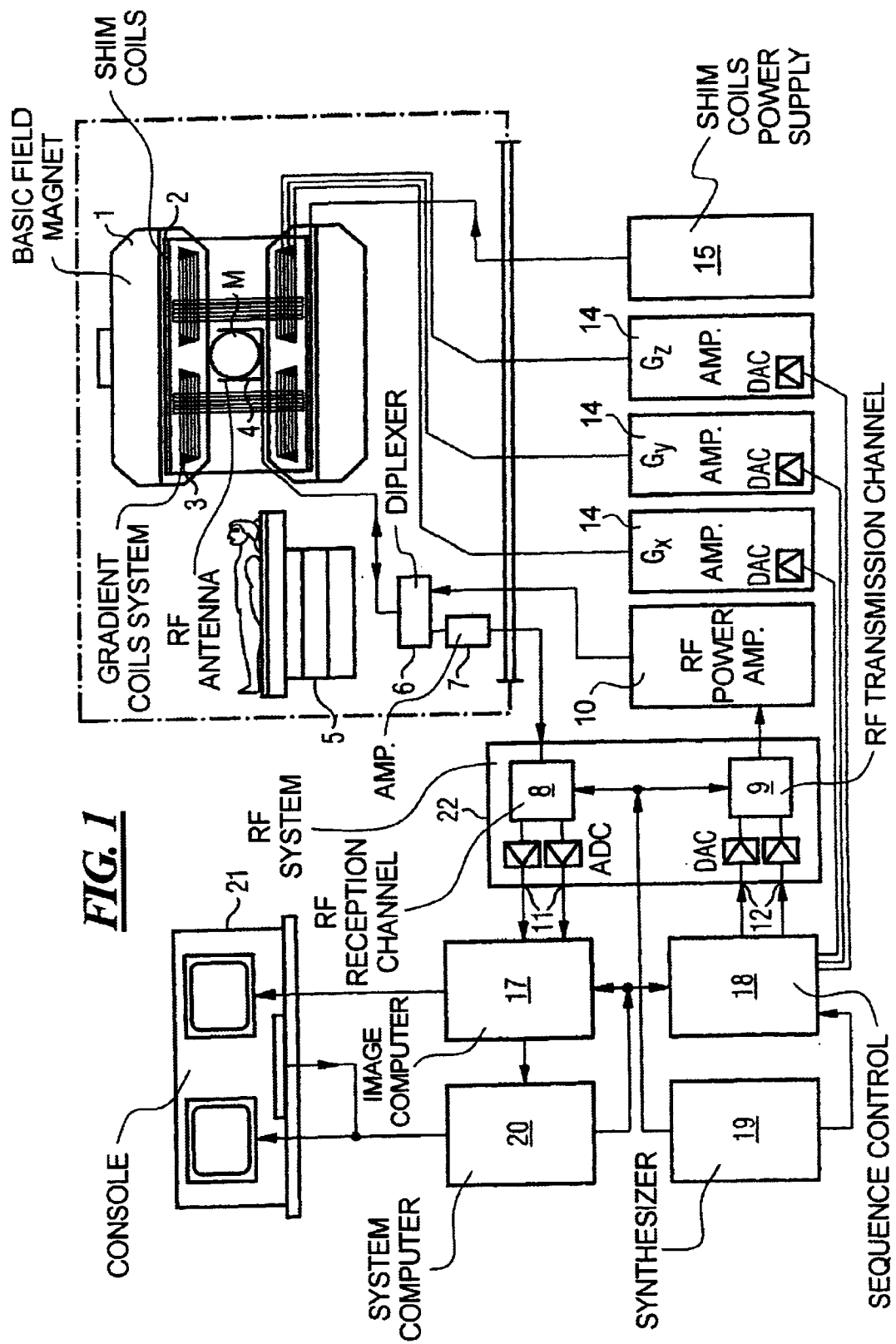
FIG. 1 is a schematic illustration of an inventive magnetic resonance imaging (tomography) apparatus.

FIG. 1 is a schematic illustration of a magnetic resonance imaging (tomography) apparatus for generating a magnetic resonance image of a subject according to the present invention. The basic structure of the inventive magnetic resonance tomography apparatus corresponds to the structure of a conventional, tomography apparatus, with the differences discussed below. A basic field magnet 1 generates a temporally constant, strong magnetic field for the polarization or alignment of the nuclear spins in the examination region of a subject such as, for example, part of a human body to be examined. The subject is disposed on a bed or support 5. The high homogeneity of the basic magnetic field required for the magnetic resonance measurement is defined in a spherical measurement volume M into which the parts of the human body to be examined are introduced. For supporting the homogeneity demands and, in particular, for eliminating time-invariable influences, shim plates of ferromagnetic material are attached at suitable locations. Time-variable influences are eliminated by shim coils 2 that are driven by a shim power supply 15.

A cylindrical gradient coil system 3 that is composed of three windings is introduced into the basic field magnet 1. Each winding is supplied with power by an amplifier 14 for generating a linear gradient field in the respective directions of the Cartesian coordinate system. The first winding of the gradient field system 3 generates a gradient $G_x$ in the x-direction, the second winding generates a gradient $G_y$ in the y-direction and the third winding generates a gradient $G_z$ in the z-direction. Each amplifier 14 has a digital-to-analog converter DAC that is driven by a sequence controller 18 for generating gradient pulses at the correct time.

Located within the gradient field system 3 is a radiofrequency antenna 4 that converts the radiofrequency pulses output by a radiofrequency power amplifier 10 into a magnetic alternating field for exciting the nuclei and causing the nuclear spins of the examination subject of the region under examination in the subject to process. The radiofrequency antenna 4 is composed or one or more RF transmission coils and one or more RF reception coils, possibly composed of an arrangement of component coils (generally called "coil arrays" or "phased array coils"). The RF reception coils of the radiofrequency antenna 4 also convert the alternating field emanating from the processing nuclear spins, i.e. the nuclear magnetic resonance echo signals usually produced by a pulse sequence composed of one or more radiofrequency pulse and one or more gradient pulses, into a voltage that is supplied via an amplifier 7 to a radiofrequency reception channel 8 of a radiofrequency system 22. The radiofrequency system 22 further has a transmission channel 9 in which the radiofrequency pulses for the excitation of the nuclear magnetic resonance are generated. The respective radiofrequency pulses are presented digitally as a sequence of complex numbers on the basis of a pulse sequence in the sequence controller 18 prescribed by the system computer 20. As a real part and an imaginary part, this number sequence is supplied via respective inputs 12 to a digital-to-analog converter DAC in the radiofrequency system 22 and is supplied therefrom to a transmission channel 9. In the transmission channel 9, the pulse sequences are modulated on a radiofrequency carrier signal whose base frequency corresponds to the resonant frequency of the nuclear spins in the measurement volume.

The switching from transmission to reception mode ensues via a transmission-reception diplexer 6. The RF transmission coil of the radiofrequency antenna 4 emits the radiofrequency pulses for the excitation of the nuclear spins into the measurement volume M and samples resultant echo signals via the RF reception coils. The correspondingly acquired magnetic resonance signals are phase-sensitively demodulated in the reception channel 8 of the radiofrequency system 22 and are converted via respective analog-to-digital converters ADC into a real part and an imaginary part of the measured signal. An image computer 17 reconstructs an image from the measured data acquired in this way. The administration of the measured data, on the image data and on the control programs ensues via the system computer 20. On the basis of a prescription with control programs, the sequence controller 18 controls the generation of the desired pulse sequences and the corresponding sampling of k-space. In particular, the sequence controller 18 controls the temporally correct switching of the gradients, the emission of the radiofrequency pulses with defined phase and amplitude as well as the reception of the magnetic resonance signals. The time base for the radiofrequency system 22 and the sequence controller 18 is made available by a synthesizer 19. The selection of corresponding control programs for generating a nuclear magnetic resonance image as well as the display of the generated nuclear magnetic resonance image ensue via a console 21 that has a keyboard as well as one or more picture screens.

Inventively, the apparatus operates in the following way:

As described above, the radiofrequency excitation pulse—among other things—is generated in the transmission channel via the system computer 20 and the sequence controller 18 by a broadband signal (for example, a sinc (si) function or a square-wave function) being superimposed on a carrier signal composed of two carrier frequencies $\omega_1$, $\omega_2$, the second frequency inventively being phase-shifted by either +90° or −90° relative to the first:

$$RF(t)=si(t)\cdot(e^{i\omega_1 t}+e^{i\omega_2 t \pm 90°}) \quad (1)$$

where $\omega_1$ and $\omega_2$ represent the offset frequencies of the neighboring slices relative to the base frequency. The two phase-shifted frequencies $\omega_1$, $\omega_2$ of the carrier signal correspond to two resonance frequencies of the nuclear spins, as a result of which the nuclear spins in two slices of the measurement volume are excited when this signal is applied. The two slices 23 and 24 are shown in FIG. 2. In the case of FIG. 2, the two slices 23 and 24 lie immediately next to one another.

RF(t) is the broadband signal that is modulated onto the carrier frequency (=base frequency)

-->transmission signal=RF(t)*exp(j*107 $_o$*t).

The magnetization densities of the two slices 23 and 24 are simultaneously registered in the form of a complex signal S(p, i) (25) that contains amplitude information as well as phase information. The registered complex signal 25 contains the magnetization density as well as the phase of the excitation pulse. The variables p and i reference the two-dimensional pixel components within a slice. Since both registered slices 23 and 24 have a constant phase position relative to one another (namely, +90° or −90°), two real images that respectively correspond to the two excited slices 23 and 24 can be reconstructed from the registered, complex image data 26 wherein the real part 27 represents the magnetization density of the first slice $M_1$ (p, i) and the imaginary part 28 represents the magnetization density of the second slice $M_2$ (p, i). The values of the two magnetization densities $M_1$ (p, i) and $M_2$ (p, i) are consequently assumed to be real numbers. The registered image S(p, i) then can be mathematically expressed as $$S(p, i)=M_1(p, i) \pm M_2(p, i) \quad (2)$$

Given the assumption that $M_1$ (p, i) and $M_2$ (p, i) are real, equation (2) can be solved for the two unknowns:

$$M_1(p,i)=Re\{S(p,i)\} \quad (3a)$$

$$M_2(p,i)=Im\{S(p,i)\} \quad (3b)$$

This theoretical assumption is justified in practice given sequences wherein fundamentally no phase fluctuations occur in the specimen between excitation and detection (in contrast to spin-echo sequences, for example, gradient echo sequences exhibit pronounced phase fluctuations since local field inhomogeneities in the echo generation are not compensated). For this reason, the use of a spin-echo sequence is advantageous with respect to the invention.

As a rule, the measurement of the magnetization density is influenced by the coil sensitivity at the location of the corresponding slice and should be taken into consideration in the calculation of $M_1$ (p, i) and $M_2$ (p, i). In contrast to the magnetization density, the coil densities $P_1$ (p, i) and $P_2$ (p, i) are assumed to be complex numbers since they also have a phase for the corresponding magnitude. The following then applies for the assumed image S(p, i):

$$S(p,i)=P_1(p,i)\cdot M_1(p,i)+i\,P_2(p,i)\cdot M_2(p,i) \quad (4)$$

In this more general case, the solution for the magnetization densities of interest is derived as:

$$M_1(p, i) = \frac{Re\{P_2(p, i)^* \cdot S(p, i)\}}{Re\{P_2(p, i)^* \cdot P_1(p,i)\}} \quad (5a)$$

$$M_2(p, i) = \frac{Im\{P_1(p, i)^* \cdot S(p, i)\}}{Im\{P_1(p, i)^* \cdot P_2(p, i)\}} \quad (5b)$$

In order to be able to reconstruct the magnetization densities $M_1$ (p, i) and $M_2$ (p,i) from S(p, i), the coil sensitivities must be known. It basically suffices when only the phases of the coil sensitivities are known. In this latter case, the magnitudes of the coil sensitivities are constant, from which it follows that the reconstructed images $M_1$ and $M_2$ are weighted with the absolute sensitivity profiles of the coils (corresponding to a variable image brightness dependent on the absolute coil sensitivity).

This is advantageous when the coil sensitivities are to be utilized directly from an image dataset that, in addition to containing the actual (low-frequency) curve of the absolute coil sensitivity, also contains the (high-frequency) structure of a subject (for example, of the body tissue). (Methods for "extracting" the subject structure require either a further measurement with a uniform coil present in the system or require an error-susceptible filtering method that is numerically very complicated.) In contrast to the amplitudes, the phases within the measurement volume generally do not change discontinuously (only low-frequency image components), the possibility of implementing the reconstruction with low-resolution coil sensitivities (that only describe the phase) deriving therefrom. This procedure (reconstruction with low-resolution coil sensitivities) can be applied given both possibilities described below.

Two embodiments for determining the coil sensitivities are as follows:

1. Implementation of a separate reference measurement in both slices, usually preceding the actual measurement. A disadvantage of this method is the lengthening of the measurement duration of the overall method connected therewith, as well as the risk that the coil sensitivity has changed, for example due movement on the part of the patient, and no longer corresponds to that at the time of the actual measurement.
2. Integration of the reference measurement into the actual image acquisition. A few, for example 16, additional measurement rows with a phase offset (i.e. −90° or, respectively, +90°) between the two slices complementary to the phase shift of the actual measurement (+90° or, respectively, −90°) are registered in the central region of k-space. Although with reduced resolution, the coil sensitivities of both slices can be completely reconstructed with these additional measurements:

Low-resolution 16-line exposure with +90° phase offset (these lines are simple taken from the high-resolution measurement):

$$\hat{S}_1(p,i) = \hat{P}_1(p,i) \cdot M_1(p,i) + i\, \hat{P}_2(p,i) \cdot M_2(p,i) \tag{6a}$$

Low-resolution 16-line exposure with −90° (complementary) phase offset (these lines are additionally measured):

$$\hat{S}_2(p,i) = \hat{P}_1(p,i) \cdot \hat{M}_1(p,i) - i\, \hat{P}_2(p,i) \cdot \hat{M}_2(p,i) \tag{6b}$$

From which:

$$\hat{P}_1(p,i) = \frac{\hat{S}_1(p,i) + \hat{S}_2(p,i)}{2\hat{M}_1(p,i)} \tag{7a}$$

$$\hat{P}_2(p,i) = \frac{\hat{S}_1(p,i) - \hat{S}_2(p,i)}{2\hat{M}_1(p,i)} \tag{7b}$$

Equation (6a) can thus be solved for M1 and M2 in the following way:

$$M_1(p,i) = |\hat{P}_1(p,i)| \frac{\mathrm{Re}\{P_2(p,i)^* \cdot S(p,i)\}}{\mathrm{Re}\{P_2(p,i)^* \cdot P_1(p,i)\}} \tag{8a}$$

$$M_2(p,i) = |\hat{P}_2(p,i)| \frac{\mathrm{Im}\{P_1(p,i)^* \cdot S(p,i)\}}{\mathrm{Im}\{P_1(p,i)^* \cdot P_2(p,i)\}} \tag{8b}$$

By multiplication by $|P^{\hat{}}(\ )|$, the unknowns $M^{\hat{}}(\ )$ drop out. As noted above, the reconstructed images are therefore weighted with the sensitivity profiles of the coils. This implicitly corresponds to a normalization of the amplitudes of the coil sensitivities to a constant value.

Because only a limited number of k-space rows are acquired in this method, the resolution of the coil sensitivities is in fact low, but is adequate since the coil sensitivities due not vary greatly between neighboring picture elements.

The signal intensity is very low for picture elements having weak magnetization, for which reason the coil profiles can be only imprecisely extracted. Artifacts arise therefrom that are visible in the image as bright noise pixels. An amplitude threshold for the signal intensity is defined for reducing these artifacts. Given signal values below this threshold, it is assumed that the phase of the coil sensitivities between first and second slice amounts to exactly +90° or, respectively, −90°, dependent on which phase shift the excitation pulse comprises. Without an excitation pulse, the relative phase between the coil sensitivities should accordingly amount to zero.

The assumption can be mathematically presented in the following way:

$$P_1'(p,i) = \hat{P}_1(p,i) - i\,\hat{P}_2(p,i) \tag{9a}$$

$$P_2'(p,i) = \hat{P}_2(p,i) + i\,\hat{P}_1(p,i) \tag{9b}$$

The functioning of this approach can be illustrated with reference to Equation (5a): bright noise pixels in the reconstructed image arise when the denominator approaches zero. This is normally not the case since the phases of the coil profiles between neighboring slices change only slightly. However, this case can occur when, due to a low signal intensity, the phases of the coil profiles were incorrectly measured. The denominator no longer can approach zero given application of the recited artifact suppression. Although the signal allocation of the two slices to be separated thus may deteriorate under certain circumstances, this can be accepted in picture elements that already have a very low signal intensity.

Two neighboring slices thus can be simultaneously registered with the inventive method, with the measurement time being reduced without losing SNR. This method does not require an array coil and significantly differs from the aforementioned (PPA) techniques and the limitations associated therewith. Of course, a combination of the inventive technique with the aforementioned known methods is possible, so that the respective advantages, higher SNR and shortened measuring time, can be simultaneously simultaneously exploited.

Although modifications and changes may be suggested by those skilled in the art, it is the intention of the inventor to embody within the patent warranted hereon all changes and modifications as reasonably and properly come within the scope of his contribution to the art.

We claim as our invention:

1. A method of generating a magnetic resonance image of a subject, comprising the steps of:

placing an examination subject in a static basic magnetic field;

simultaneously exciting nuclear spins in first and second adjacent slices of said subject with a radio frequency excitation pulse that encodes said first slice with a phase offset of +90 degrees or −90 degrees relative to said second slice, and thereby producing a magnetic resonance response signal containing magnetization information for both of said first and second slices;

generating gradient pulses that spatially encode said magnetic resonance response signals, thereby producing spatially encoded magnetic resonance response signals;

using multiple reception coils having respective coil sensitivities, which receive, said spatially encoded magnetic resonance response signals, as received signals having a real part and an imaginary part;

processing said received signals, including separating the respective magnetization information for said first and second slices dependent on said phase offset by calculating respective magnetization densities of said first and second slices from said real part and said imaginary part dependent on said coil sensitivities and making respective entries which represent said received signals, into a first plurality of rows in k space, and comprising the additional step of identifying the respective coil sensitivities by making said entries wherein said first slice is encoded with a complementary phase offset of −90 degrees or +90 degrees relative to said second slice, in a second plurality of rows of k space;

selectively combining said first plurality of rows and said second plurality of rows in identifying the respective coil sensitivities; and generating respective magnetic resonance images of said first slice and said second slice.

2. A method as claimed in claim 1 wherein said entries in said second plurality of rows of k space include magnitude information, and comprising selectively combining said first plurality of rows and said second plurality of rows independently of said magnitude information.

3. A method as claimed in claim 1 comprising selectively combining said first plurality of rows and said second plurality of rows based on a criteria that a phase of coil profiles between said first slice and said second slice is equal to exactly +90° or −90° in regions of said first and second slices having an intensity of said received signal below a predetermined threshold.

4. A method as claimed in claim 1 comprising employing a spin-echo sequence for generating said radiofrequency excitation pulses and said gradient pulses.

5. An apparatus generating a magnetic resonance image of a subject, comprising:

a basic field magnet which generates a static basic magnetic field and configured to receive an examination subject therein;

a radio-frequency system that simultaneously excites nuclear spins in first and second adjacent slices of said subject in said basic magnetic field with a radio frequency excitation pulse that encodes said first slice with a phase offset of +90 degrees or −90 degrees relative to said second slice, thereby producing a magnetic resonance response signal containing magnetization information pertaining to both of said first and second slices;

a gradient coil system that generates gradient pulses that spatially encode said magnetic resonance response signals, thereby producing spatially encoded magnetic resonance response signals;

said radio-frequency system having multiple reception coils with respective coil sensitivities that receive said spatially encoded magnetic resonance response signals, as received signals having a real part and an imaginary part;

a processor that processes said received signals, including separating the respective magnetization information into said first and second slices dependent on said phase offset by calculating respective magnetization densities of said first and second slices from said real part and said imaginary part, and wherein said processor identifies the respective coil sensitivities by making respective entries, representing said received signals, in a first plurality of rows in k space, wherein said first slice is encoded with a complementary phase offset of −90 degrees or +90 degrees relative to said second slice, in a second plurality of rows of k space;

selectively combining said first plurality of rows and said second plurality of rows in identifying the respective coil sensitivities; and generating respective magnetic resonance images of said first slice and said second slice.

6. An apparatus as claimed in claim 5 wherein said processor makes said entries in said second plurality of rows of k space including magnitude information, and selectively combines said first plurality of rows and said second plurality of rows independently of said magnitude information.

7. An apparatus as claimed in claim 5 wherein said processor selectively combines said first plurality of rows and said second plurality of rows based on a criteria that a phase of coil profiles between said first slice and said second slice is equal to exactly +90° or −90° in regions of said first and second slices having an intensity of said received signal below a predetermined threshold.

8. An apparatus as claimed in claim 5 wherein a spin-echo sequence is employed in generating said radio frequency excitation pulses and said gradient pulses.

* * * * *